United States Patent [19]

Morita et al.

[11] Patent Number: 5,185,550
[45] Date of Patent: Feb. 9, 1993

[54] STRUCTURE FOR SUPPORTING A RESONATOR USING AN ULTRATHIN PIEZOELECTRIC PLATE IN A PACKAGE

[75] Inventors: Takao Morita; Osamu Ishii; Takebumi Kurosaki, all of Kanagawa, Japan

[73] Assignee: Toyo Communication Equipment Co., Ltd., Kanagawa, Japan

[21] Appl. No.: 768,923

[22] PCT Filed: Nov. 22, 1990

[86] PCT No.: PCT/JP90/01527
§ 371 Date: Oct. 9, 1991
§ 102(e) Date: Oct. 9, 1991

[87] PCT Pub. No.: WO91/12663
PCT Pub. Date: Aug. 22, 1991

[30] Foreign Application Priority Data

Feb. 9, 1990 [JP] Japan .................. 2-29936
Feb. 21, 1990 [JP] Japan .................. 2-40827
May 25, 1990 [JP] Japan .................. 2-136136
Sep. 3, 1990 [JP] Japan .................. 2-232655

[51] Int. Cl.⁵ ..................... H01L 41/04; H01L 41/08
[52] U.S. Cl. ..................... 310/344; 310/346; 310/348; 310/355; 310/361
[58] Field of Search ............... 310/314, 346, 348, 355, 310/356, 357, 361, 367, 368, 369

[56] References Cited

U.S. PATENT DOCUMENTS

| | | | |
|---|---|---|---|
| 3,694,677 | 9/1972 | Guttwein et al. | 310/367 |
| 4,430,596 | 2/1984 | Shanley | 310/348 |
| 4,517,485 | 5/1985 | Berté et al. | 310/369 |
| 4,626,732 | 12/1986 | Debaisieux et al. | 310/348 |
| 4,639,632 | 1/1987 | Nakata et al. | 310/344 |
| 4,703,218 | 10/1987 | Takahashi et al. | 310/348 |
| 4,845,397 | 7/1989 | Herrick et al. | 310/348 |

FOREIGN PATENT DOCUMENTS

| | | | |
|---|---|---|---|
| 0040092 | 3/1977 | Japan | 310/344 |
| 53-12292 | 2/1978 | Japan . | |
| 54-107293 | 8/1979 | Japan . | |
| 58-219810 | 12/1983 | Japan . | |
| 0580621 | 11/1977 | U.S.S.R. | 310/344 |
| 0705642 | 12/1979 | U.S.S.R. | 310/344 |

OTHER PUBLICATIONS

International Search Report, Corresponding Application No. PCT/JP90/01527.

Primary Examiner—Emanuel T. Voeltz
Assistant Examiner—C. LaBalle
Attorney, Agent, or Firm—Fish & Richardson

[57] ABSTRACT

In a piezoelectric resonator having an ultrathin vibratory portion formed by a cavity made in a piezoelectric block and a thick frame-like rib formed integrally with said vibratory portion and surrounding it, an excess adhesive receiving groove or the like is cut in one marginal portion of the frame-like rib between an adhesive coated region. The resonator is fixedly housed in a package by use of an adhesive coated on one marginal portion of the frame-like rib along the z-axis direction, or by means of elastic pawls without using the adhesive. In this case, one marginal portion of the frame-like rib on the opposite side from a pad deposited on one side of the piezoelectric resonator is bonded to the bottom of the package. With such a structure, it is possible to prevent the adhesive from flowing into the cavity to cause variations in the resonance frequency of the piezoelectric resonator, to reduce the scatter of the temperature-frequency characteristic of a piezoelectric device using the resonator housed in a package during mass production, and to increase the bond strength of wire bonding for electrical connection of the piezoelectric resonator incorporated in the package.

6 Claims, 13 Drawing Sheets

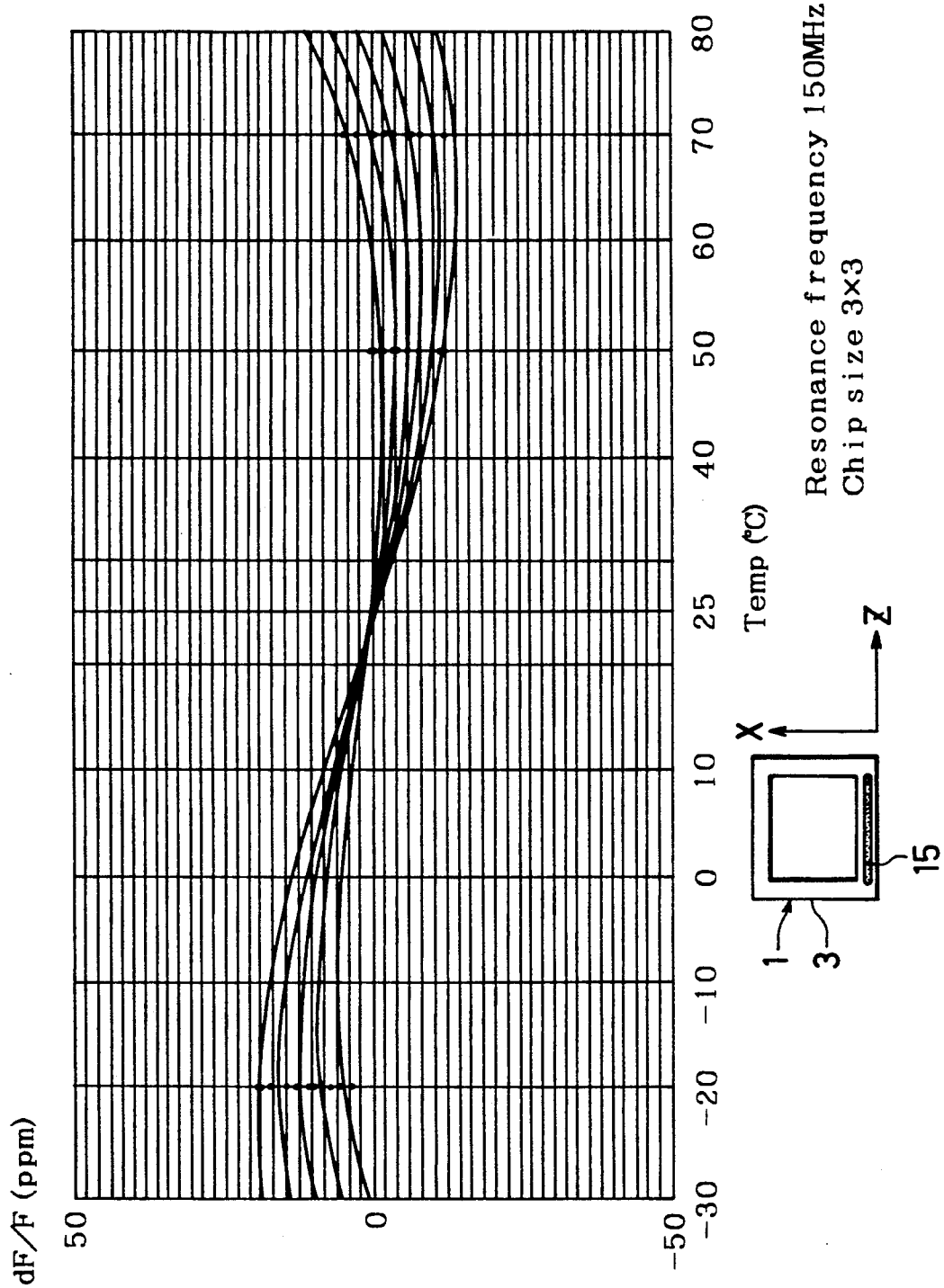

Direction of cracking

STRUCTURE FOR SUPPORTING A RESONATOR USING AN ULTRATHIN PIEZOELECTRIC PLATE IN A PACKAGE

TECHNICAL FIELD

The present invention relates to a structure by which a resonator using an ultrathin piezoelectric plate capable of providing resonance frequencies as high as tens to hundreds of megahertz can be supported in a package.

PRIOR ART

In recent years there has been a strong and growing demand for high frequency operation and high frequency stability of various pieces of electronic and communication equipment. An ordinary AT cut quartz crystal resonator, which has heretofore been used widely as a piezoelectric device (such as a resonator or filter), has a very excellent temperature-frequency characteristic; however, since its resonance frequency is inversely proportional to its thickness, the fundamental frequency of this kind of resonator with a mechanical strength sufficient for practical use is around 40 MHz at the highest.

There has also been widely employed what is called overtone oscillation which extracts a higher order harmonic mode vibration of an AT cut quartz crystal resonator to obtain a frequency which is an odd multiple of the fundamental resonance frequency, but its oscillation circuit calls for an LC tuning circuit including a coil, and hence is not suitable for fabrication as a semiconductor IC, besides the overtone oscillation circuit may sometimes be difficult to activate because such a resonator has a large capacitance ratio and consequently a high impedance level.

On the other hand, a surface acoustic wave (SAW) resonator, whose oscillation frequency is determined by the pitch of electrodes of an interdigital transducer, has come to be able to output a maximum of 1 GHz or so due to the progress in photolithography, but a piezoelectric substrate usable for the SAW resonator is remarkably inferior to the AT cut quartz crystal in terms of temperature-frequency characteristic.

To solve the above-mentioned problems, there has been proposed such a piezoelectric resonator as shown in FIGS. 10(a) and (b).

That is, a cavity or recess 5 is formed, by machining or etching, in one side of a block 1 of AT cut quartz crystal substantially centrally thereof as depicted in FIGS. 10(a) and (b) and the thickness of a vibratory portion 2 forming the bottom of the cavity 5 is selected about 16 μm, for example, if a fundamental resonance frequency of 100 MHz is desired.

On the side of the block where the cavity 5 is formed, the ultrathin vibratory portion 2 is edged with a thick frame-like marginal portion (or) rib 3 formed integrally therewith. The ultrathin vibratory portion 2 can be retained in its required shape by the frame-like rib 3. In this instance, it is preferable that excitation electrodes for the piezoelectric block be composed of an overall electrode 12 formed on the side of the block where the cavity 5 is provided and a partial electrode 14 and an electrode lead pattern 14a on the opposite side of the cavity 5, the electrode lead member 14a extending from the partial electrode 14 to one end face of the block.

It is customary and technically advantageous to house such a resonator of the above construction upside down—with the cavity 5 facing downward—in a ceramic or similar package 11 which has a concave housing space 10 centrally thereof and to mechanically bond and electrically connect the top 3a of one side of the frame-like marginal portion 3, by a conductive adhesive coated in line thereon, to a conductive film 16 which is exposed on the bottom of the housing space 10, hermetically passes through the package and is connected to an external lead member 17 projecting out of or exposed on the outside of the package, as shown in FIG. 11(a).

The piezoelectric device of such a construction has turned out to be defective in that since the resonator is very small, it is hard to control the amount of conductive adhesive used for bonding the top 3a of one side of the frame-shaped rib 3 to the bottom of the package 11, and consequently, the excess adhesive may sometimes flow into the cavity 5 and hence increases the thickness of the vibratory portion 2, causing a variation in the resonance frequency.

In view of the above-noted defects of the conventional resonator using an ultrathin piezoelectric plate, a first object of the present invention is to provide a piezoelectric resonator support structure with which it is possible to support, in a package, a piezoelectric resonator of the type having an ultrathin vibratory portion formed by the bottom of a cavity made in a block of quartz crystal or the like, without causing a variation in the resonance frequency of the resonator which is attributable to the inflow of the excess adhesive into the cavity which is likely to occur when fixing the top of one marginal portion of the frame-shaped rib of the resonator to the bottom of the package.

Incidentally, the inventors of the present invention have proposed in Japanese Patent Public Disclosure Gazette No. 52529/89 an electrode arrangement for the piezoelectric resonator using such an ultrathin piezoelectric plate, which is composed of an overall electrode formed on the side of the plate where the above-mentioned cavity is made and a partial electrode and an electrode lead pattern extending therefrom on the planar surface of the piezoelectric block on the side opposite from the overall electrode. In the prior application it is also suggested that such an electrode arrangement does not call for any particular method or process therefor and allows ease in fixing mounting of the resonator in a flat package and in the connection of the one electrode to an external lead member could easily be done, by fixing the resonator at the side of the overall electrode to a conductive film which is exposed on the bottom of the package by use of a conductive adhesive.

However, substantially no studies have been made so far as to what method should be used to fixedly mount the resonator of such structure in a required package without impairing its various characteristics, partly because the resonator has been confined to studies in laboratories and has not been mass-produced. As a result of trial production of such a resonator as mentioned above, it has been found out that it is difficult to define the area for bonding one marginal portion of the resonator to the bottom of the flat package by use of a conductive adhesive, because the resonator is primarily as small as 3 mm ×3 mm so as to meet severe requirements for microminiaturization of various pieces of electronic equipment. Furthermore, it has also been found out that strain or stress induced in the adhesive by its hardening is applied directly to the resonator, inevitably causing variations in its resonance frequency and temperature-frequency characteristic after packaging.

In view of the fact that various characteristics of a piezoelectric resonator using such an ultrathin piezoelectric substrate as mentioned above are appreciably influenced by the position where the resonator is fixed to a predetermined package, a second object of the present invention is to provide an ultrathin quartz crystal resonator support structure which suppresses scattering of various characteristics of the piezoelectric device, in particular its temperature-frequency characteristic.

In the case of connecting bonding pads 14b formed on the planar surface of the resonator to external lead connecting pads 27, exposed in the package 11, by bonding wires 28 after fixedly mounting the resonator in the package in such a manner as referred to above in respect of FIG. 11 (a), the marginal portion 3 of the piezoelectric plate 1 where the bonding wires 28 are to be attached is pressed down and the piezoelectric plate 1 is elastically bonded by a bonder around the adhering axis between the resonator and the bottom of the package and consequently the pressure applied to the pad 14b is diminished, because the above-mentioned marginal portion of the piezoelectric plate is slightly spaced apart from the bottom of the package as seen from FIG. 11(a). In consequence, the connection between the electrode lead pattern and the bonding wire(s) may sometimes by insufficient, often causing trouble such as disconnection of the latter from the former in a mass-production test, impact and vibration tests, etc.

In view of the above-noted problems which are expected to encounter in the fabrication of the resonator due to the structure of its electrode lead pattern connecting portions, a third object of the present invention is to provide an electrode lead structure which provides for increased strength in wire bonding for electrical connection of the resonator incorporated in a package.

Apart from the foregoing, there are cases where the piezoelectric resonator is required to have an extremely severe temperature-frequency characteristic, but it is expected that such a severe requirement cannot be met even by a combination of the above-described techniques.

It is therefore a fourth object of the present invention to provide resonator packaging structure which allows fixing the resonator to its package without using adhesive and permits electrical connection of the electrodes formed on both sides of the piezoelectric plate to external lead members posed by the packaging of the resonator.

SUMMARY OF THE INVENTION

To attain the first object, the resonator using the ultrathin piezoelectric plate of the present invention has an excess adhesive receiving groove cut in the top of the marginal portion of the frame-like rib of the piezoelectric block along the portion to be coated the conductive adhesive at the side of the cavity.

To attain the second object, according to the present invention, the AT cut quartz crystal block forming the resonator is fixed to a predetermined package at positions along the z axis of one marginal edge of the frame-like rib.

To attain the third object, according to the present invention, one marginal portion of the frame-like rib which is opposite to a bonding pad formed at the same marginal portion of the piezoelectric block is cemented to the bottom of the package.

To attain the fourth object, according to the present invention, the resonator is fixed to the package by elastic claws projecting out from the inner wall or bottom of the package and the electrode of the resonator facing toward the bottom of the package is connected to a conductive pad on the other surface of the piezoelectric block via a conductive film deposited on the interior surface of a through hole piercing the piezoelectric block or a groove having a conductive coating on the side of the block, for connection to an external lead member of the package.

DETAILED DESCRIPTION OF THE INVENTION

Figure 1:
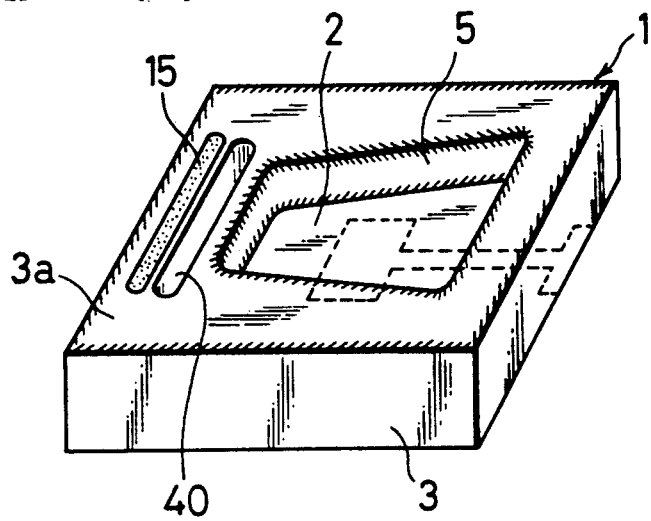
FIG. 1(a), (b) and (c) are a perspective view, a plan view and a sectional view showing the construction of a quartz crystal resonator according to a first embodiment of the present invention.
Figure 1:
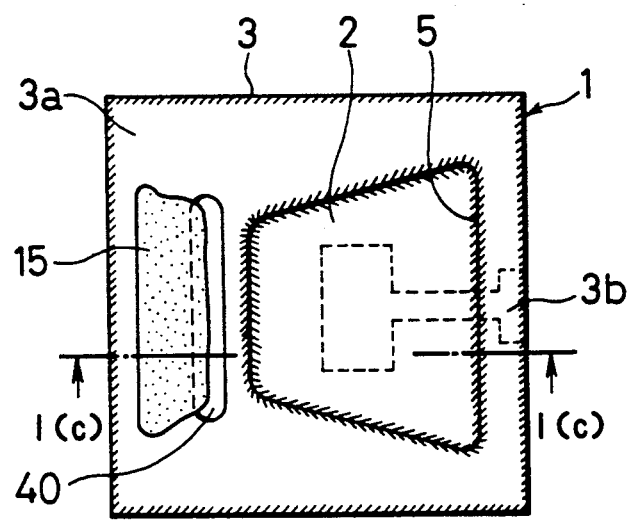
Figure 1:
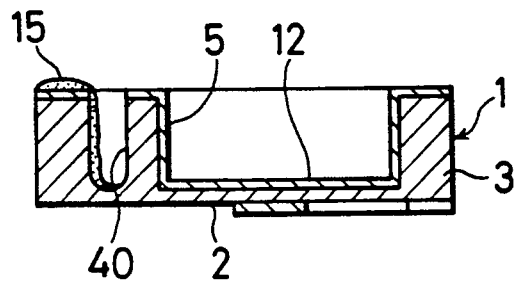

The present invention will hereinafter be described in detail with respect to its preferred embodiments shown in the accompanying drawings.

FIGS. 1(a) and (b) are a perspective view and a plan view illustrating the construction of the resonator using an ultrathin quartz crystal plate fabricated in accordance with a first embodiment of the present invention, and FIG. 1(c) is a sectional view taken on the line 1C—1C in FIG. 1(b). As is the case with the afore-mentioned prior art example, the AT cut quartz crystal resonator has the cavity 5 formed by etching or machining in one side of the rectangular parallelpipedec block 1 or AT cut quartz crystal substantially centrally thereof so that the bottom of the cavity 5 forms the untratin vibratory portion 2 edged with the thick frame-like marginal portion (rib) 3. In this embodiment, however, the AT cut quartz crystal resonator has an excess adhesive receiving groove 40 cut in the top of the marginal portion of the rib 3 along the conductive adhesive coated portion (for fixing the quartz crystal) 3a near the cavity 5 so that excess adhesive 15, which oozes from the adhesive coated portion when bonding the resonator to the package, flows into the groove 40, and hence is prevented from flowing into the cavity 5.

The groove 40 can be formend by etching simultaneously with the formation of the cavity 5, and accordingly, any particular manufacturing step is not needed therefor.

It is necessary that the groove 40 be formed substantially in parallel to the conductive adhesive coated region 3a and that its width, length, depth and shape be set so that the overflowing excess adhesive 15 can be prevented from flowing into the cavity 5. From this point of view, the groove 40 may also be a slit extending through the frame-like marginal portion of the rib 3.

The groove 40 need not always be limited specifically to such a straight-shaped one as shown but may also be provided at both ends with large adhesive reservoirs 41 as depicted in FIG. 2(a). Alternatively, it is possible to open the groove 40 to one end of the quartz crystal block 1 near the adhesive coated region 3a to let the excess adhesive 15 run down to the bottom of the package through the open ends 42. Thus, the area of bonding the quartz crystal block 1 to the bottom of the package can be defined.

In the above embodiment the resonator is fixedly held in a cantilevered fashion at one marginal portion of the frame-like rib. Such a structure is effective in the reduction of scattering of the resonance frequency of the resonator, improving its temperature-frequency charactristic and other characteristics. With the structure, however, the resonator is very likely to be broken down by flapping due to a vibration or shock applied thereto. To avoid this, the marginal portion 3b of the frame-like rib opposite the adhesive coated region 3a across the cavity 5 may sometimes by joined at one corner 3b' to the bottom of the package at the sacrifice of improvement in the above-mentioned various characteristics of the resonator. Also, in such an instance, a groove 45 may preferably be provided as shown in FIG. 2(c) so as to define the area of joining the portion 3b' to the bottom of the package.

Figure 2:
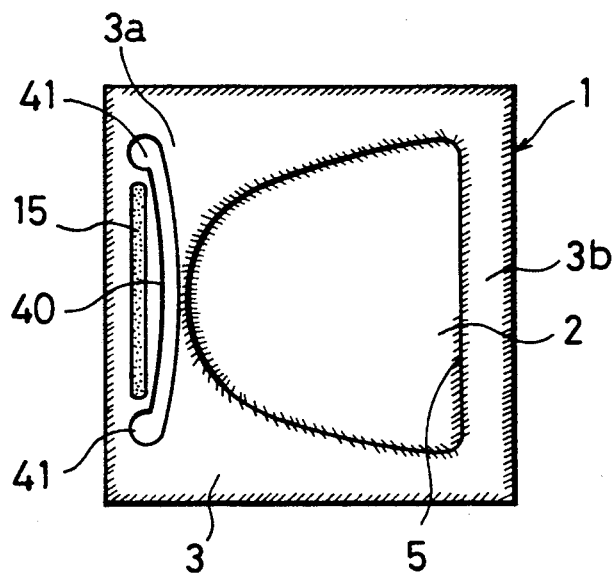
FIGS. 2(a) and (b) are plan views of modified forms of the FIG. 1 embodiment.
FIG. 2(c) is a partial plan view of another modification.
Figure 2:
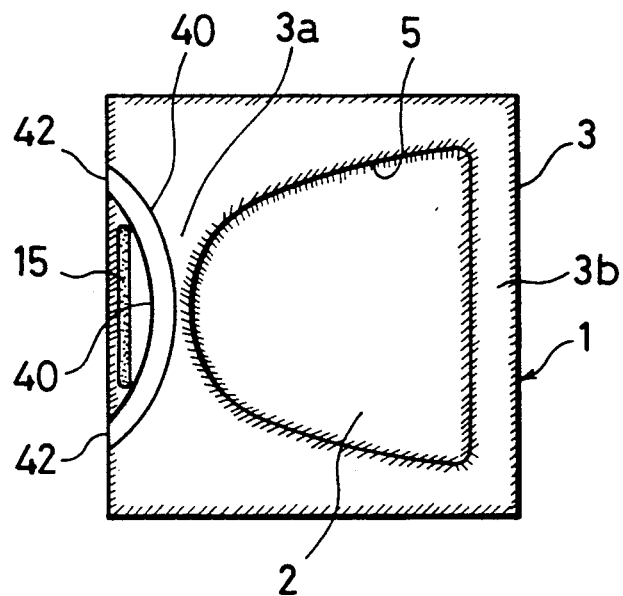
Figure 2:
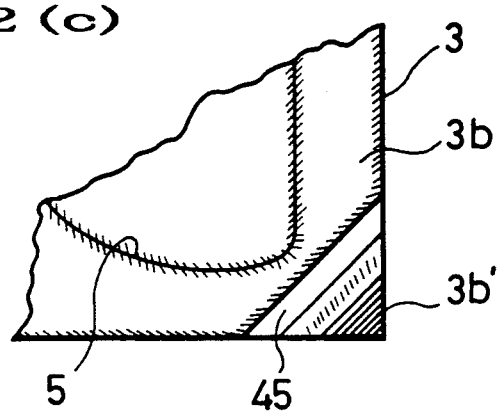

The gist of each of the FIGS. 1 and 2 embodiments according to the first aspect of the present invention resides in the structure for preventing the adhesive from flowing into the cavity by forming the excess adhesive receiving groove in the top of one marginal portion of the frame-like rib between the adhesive coated region and the cavity as described above. Hence, any structures capable of producing the same effect as mentioned above fall inside the scope of the present invention.

Although in the above the piezoelectric resonator is housed with its cavity facing toward the bottom of the package, it is needless to say that the present invention is also applicable to the case where the resonator is housed with its planar surface facing toward the bottom of the package.

The above embodiments have been described with respect to the case where the piezoelectric resonator is a AT cut quartz crystal resonator, but this should be construed as being merely illustrative of the invention and the invention is applicable as well to devices which utilize piezoelectric materials other than the AT quartz crystal. Moreover, while the embodiments have been described to employ the rectangular block of a piezoelectric material, this configuration is needed merely for providing enhanced mass productivity of the resonator by use of a batch system, and hence the present invention is not limited specifically thereto. Accordingly, the present invention can equally be applied to resonators of circular, polygonal and other forms as viewed from above.

Thus, the embodiments shown in FIGS. 1(a) to (c) and 2(a) to (c) according to the first aspect of the present invention are intended to solve the afore-mentioned first object of the invention and are capable of substantially completely preventing that when the resonator having the ultrathin vibratory portion is joined to the bottom of its package, the excess adhesive flows into the vibratory portion of the resonator, causing a variation in its resonance frequency. Furthermore, these embodiments call for any high precision adhesive dispenser, and hence require any particular equipment, and they permit simultaneous formation of the excess adhesive receiving groove with the cavity. Accordingly, the structures of the above embodiments not only improve the yield rate of product but also decrease the manufacturing cost of the type of piezoelectric resonator.

Next, embodiments according to the second aspect of the present invention for attaining the afore-mentioned second object thereof will be described, based on experimental data.

Figure 10A:
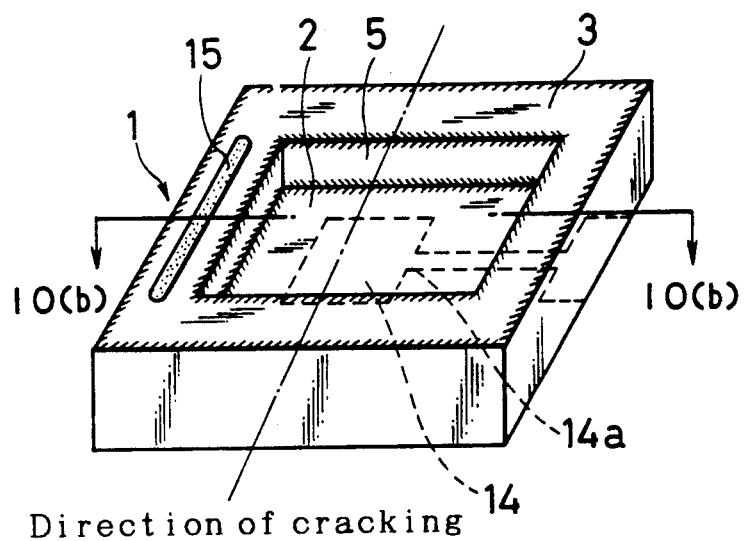
FIGS. 10(a) and (b) are a perspective view showing the construction of conventional resonator using an ultrathin piezoelectric plate and a sectional view taken on the line 10B—10B in FIG. 10(a), showing how the resonator is housed in a package.
Figure 10B:
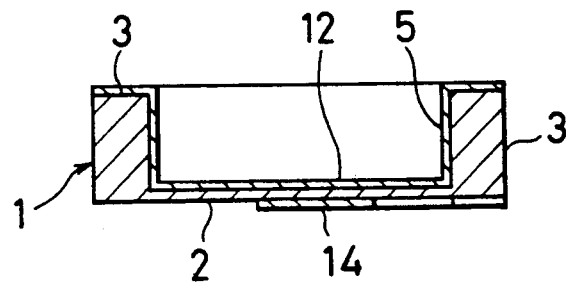
Figure 11:
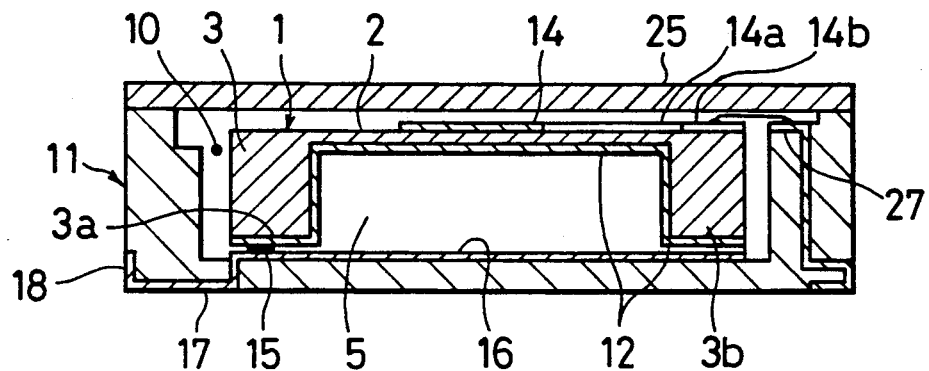
FIGS. 11(a) and (b) is a sectional view and a plan view showing how the conventional resonator using an ultrathin piezoelectric plate is housed in the package.
Figure 11:
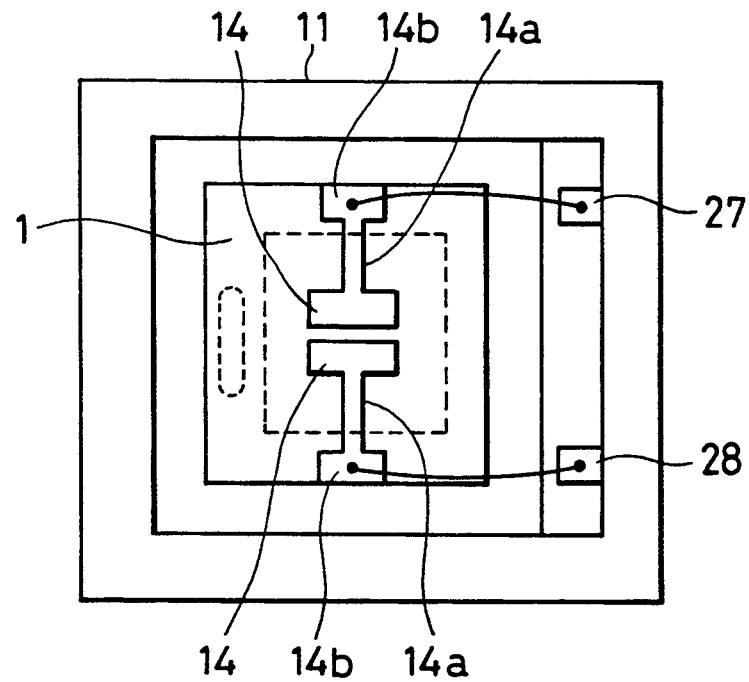

As referred to previously, the inventor of the subject application has found out, in the mass-production test of the AT cut quartz crystal resonator depicted in FIGS. 10(a) and (b), that its temperature-frequency characteristic appreciably scatters according to the position where the resonator incorporated therein is bonded to the bottom of its package.

Figure 3A:
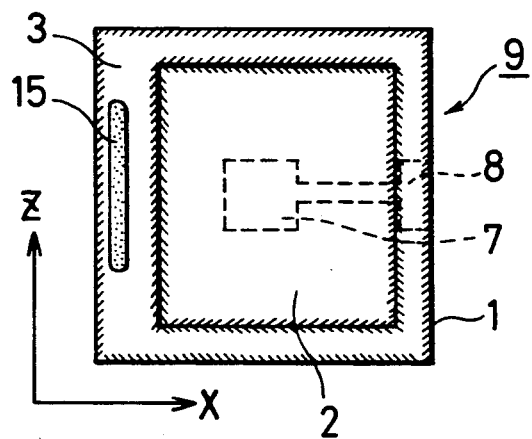
FIGS. 3(a) and (b) are plan views of showing different examples of resonators to which a second embodiment of the present invention is to be applied.
Figure 4:
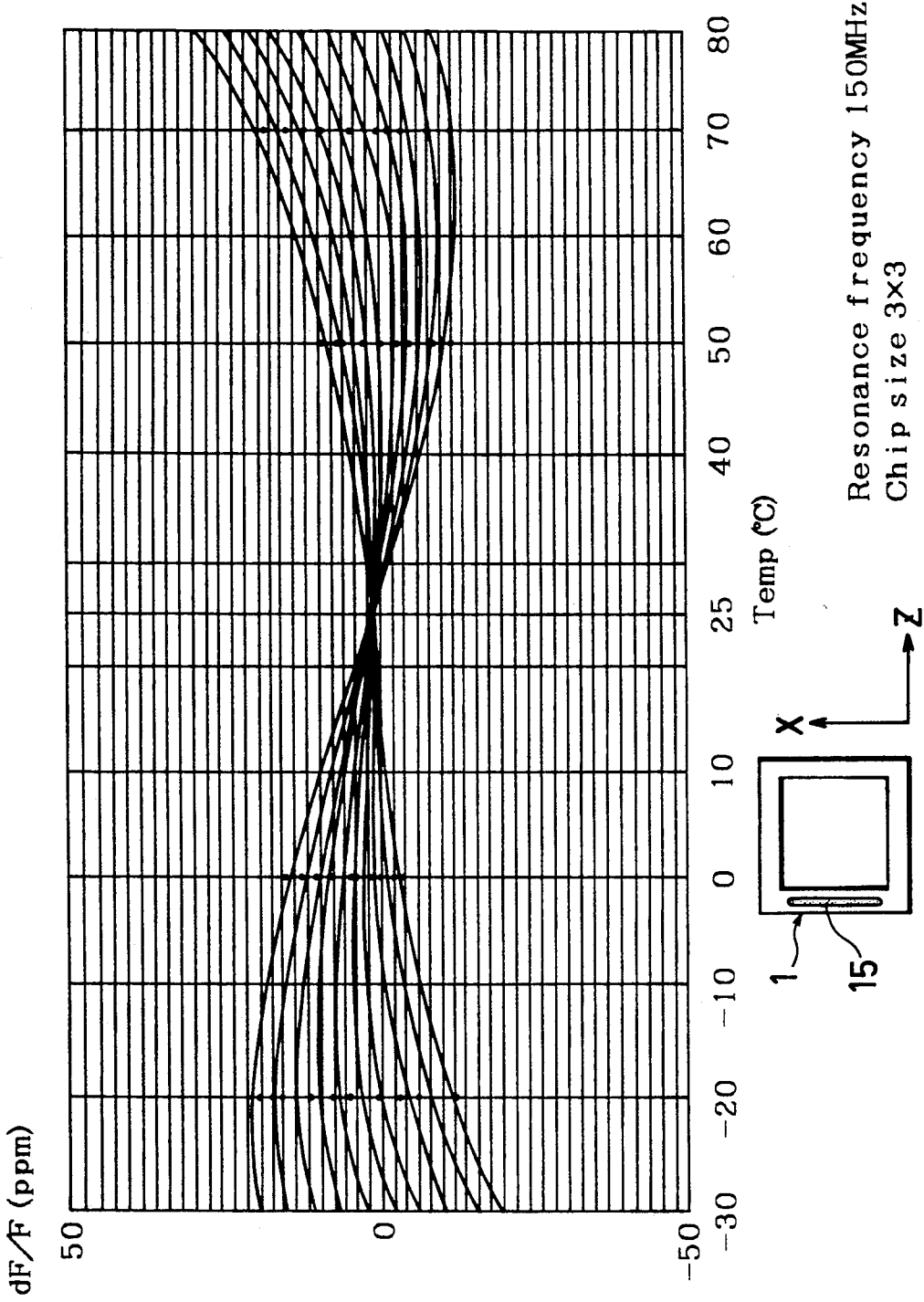
FIGS 4(a) and (b) are graphs showing data of comparison tests for confirming the effect by the second embodiment of the present invention.

For further studies of this problem, the present inventors produced ten samples in which the resonator 9 was joined to the bottom of the package at one marginal portion of the frame-like rib 3 along the z axis of the AT cut quartz crystal block 1 and ten samples in which the resonator 3 was joined to bottom of the package along the x axis of the block 1, as shown in FIG. 3(a), and the conducted experiments on the scatter of their temperature-frequency characteristic. FIGS. 4(a) and (b) show the results of the experiments.

As is evident from the experimental results, the scatter of the temperature-frequency characteristic of the resonator fixed to the package along the z axis of the AT cut quartz crystal block 1 is less than in the case of the resonator fixed to the package along the x axis of the AT cut quartz crystal block 1.

As regards other characteristics, no significant differences were observed between the two types of piezoelectric devices, though no reference is made to experimental data.

It is not clear so far what brought about such experimental results, but at any rate, it is clear that the resonator of the type using the AT cut quartz crystal plate should be fixed to the package along the z axis.

Figure 3B:
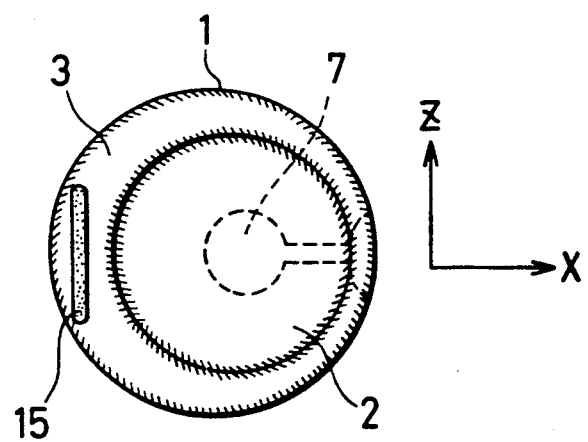

While in the above the present invention has been described in connection with the case where the resonator using a rectangular quartz crystal block is fixedly jointed to the package at one marginal portion of the frame-like rib surrounding the cavity, the invention need not always be limited specifically thereto. For instance, if the quartz crystal block 1 is disc-shaped as depicted in FIG. 3(b), the adhesive 15 needs only to be coated on a marginal portion along its z axis. Even if the resonator is fixedly joined to the package at one marginal portion along the z axis on the planar surface of the quartz crystal block 1 on the opposite side from the cavity 2, the above-mentioned effect can be obtained. The present invention is also applicable to a resonator of the type having the partial electrode on the side of the AT cut quartz crystal block 1 where the cavity 5 is provided and the overall electrode on the opposite side, and the piezoelectric device including the AT cut quartz crystal plate according to the present invention may be either of a resonator and a filter element (including what is called multimode quartz crystal filter element having split electrodes).

Incidentally, it will be convenient for mounting the resonator in the package that the region where to coat the adhesive is clearly indicated by marking it with paint at both sides thereof.

The embodiments according to the second aspect of the present invention are as described above, and hence afford reduction of the scatter of the temperature-frequency characteristic of the ultrathin piezoelectric resonator in the mass production thereof, without involving any particular manufacturing step, thus ensuring the production of piezoelectric devices of uniform quality.

Next, an embodiment according to the third aspect of the present invention for attaining the afore-mentioned third object thereof will be described with respect to a resonator using an ultrathin piezoelectric plate is housed in a package according to the third aspect of the present invention. The resonator has a cavity 215 formed by machining or etching in one side of, for example, a rectangular parallelpipedic block 200 of AT cut quartz crystal substantially thereof so that the bottom of the cavity 215 forms a vibratory portion 216 which is mechanically supported by thick frame-like rib 217 surrounding it.

The quartz crystal block 200 is deposited over the entire area of its surface where the cavity 215 is provided, with a conductive film to form an overall electrode 218. On the planar surface of the block 200 on the opposite side from the overall electrode 218 there are formed a partial electrode 206 and an electrode lead pattern 231 extending therefrom. The lead pattern 231 has its end portion formed by a bonding pad 234 which is connected by a wire 233 to an external lead member 232 of package 20. On a stepped portion of the package 20 inside thereof, opposite the pad 234, there is disposed a conductor pad 235 which is connected to the external lead member 232.

One marginal portion of the frame-like rib 217 on the opposite side from the pad 234 is joined to the bottom of the package and then the pads 234 and 235 are connected by the wire 233.

With the above structure wherein one side of one marginal portion of the piezoelectric body 200 is bonded to the bottom of the package and the pad 234 deposited on the other side of the marginal portion 217 is wire-bonded to the pad 235 deposited on the stepped portion on the inner wall of the package 20 facing toward the above-mentioned marginal portion, the bond strength of the pad 234 bonded to the bottom of the package 20 is effectively increased when the pad 234 is pressed by a bonder head.

The above structure according to the third aspect of the present invention fully utilizes the bonding pressure of the wire bonder for the electrical connection between the piezoelectric plate and the package, and hence ensure the connection between the electrode lead member of the resonator and the external lead member of the package, thus providing for remarkably improved reliability of the piezoelectric device.

Next embodiments according to the fourth aspect of the present invention for attaining the afore-mentioned fourth object thereof will hereinafter be described in detail.

As referred to previously, in the resonator of such a structure as depicted in FIGS. 10(a) and (b), the quartz crystal block is so small that when one marginal portion of the frame-like rib is fixedly attached to the bottom of the package by use of a conductive adhesive, strain resulting from hardening of the adhesive is applied directly to the quartz crystal block, causing a variation in the resonance frequency of the resonator and the scatter of its temperature-frequency characteristic.

To solve this problem, the resonator according to the present invention basically employs such a packaging structure as shown in FIGS. 5(a) to (d).

This embodiment does not employ the conventional method of fixing a piezoelectric resonator having an ultrathin vibratory portion 100 directly to the bottom of a package by use of a conductive adhesive, but instead fixes the resonator by pressing it at four corners with fork-shaped elastic claws extending from the inner wall of the package.

That is to say, the package 108 with the claws 116, 116 . . . can easily be obtained by punching a thin plate of an elastic material such as phosphor bronze into a pattern having the claws 116, 116 . . . extending from a lead frame 117, as shown, by forming the pattern as required and then by embedding the lead frame 117 in the inner wall of the ceramic package 108 during its sinter forming.

Figure 5A:
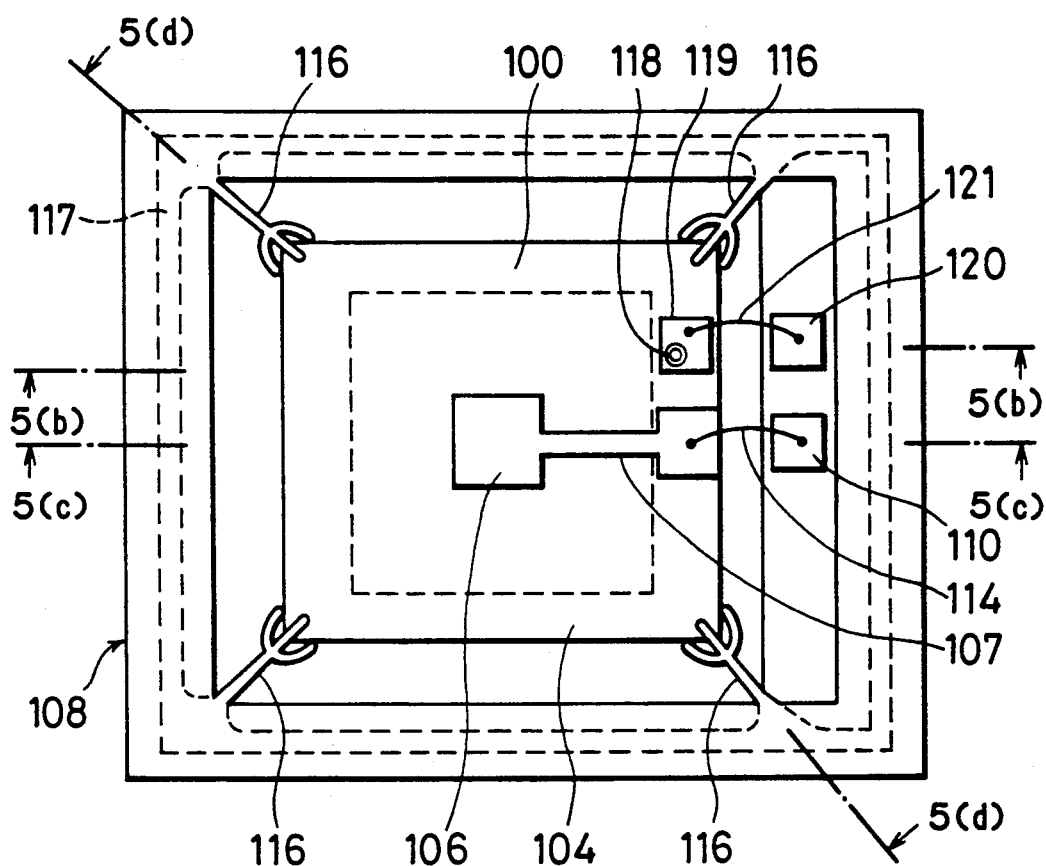
FIG. 5(a) is a plan view illustrating a basic example of the ultrathin piezoelectric resonator packaging structure according to a third embodiment of the present invention.

As will be seen from FIG. 5(a), by inserting the resonator 100 into the package 108 having the claws 116, 116 . . . while at the same time pressing down their tips with the marginal edge of the resonator 100, the claws 116, 116 . . . are restored to their initial positions by their elasticity and press the resonator 100 at its four corners as soon as the resonator 100 is pressed down into contact with the bottom of the package 108.

In the case where the resonator 100 is housed in the package 108 by such a method as mentioned above, however, no stable electrical connection can be established between an overall electrode 105 on the side where the cavity 102 of the resonator 100 is formed and a conductive film deposited on the bottom of the package 108.

Figure 5B:
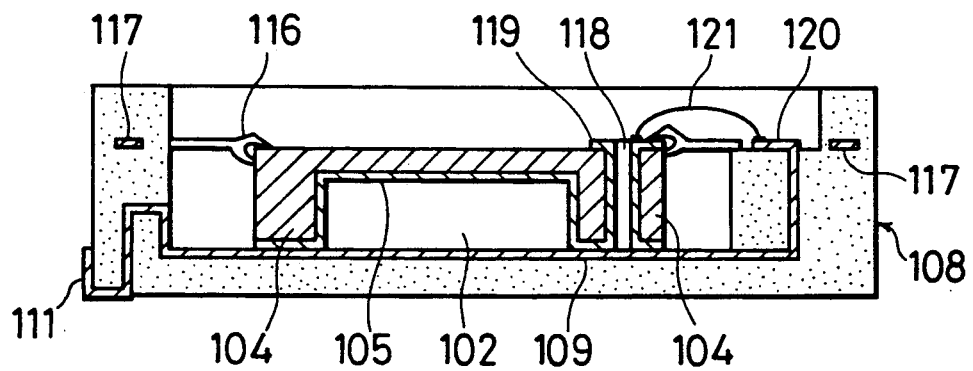
FIGS. 5(b), (c) and (d) are sectional views taken on the lines 5B—5B, 5C—5C and 5D—5D in FIG. 5(a)
Figure 5C:
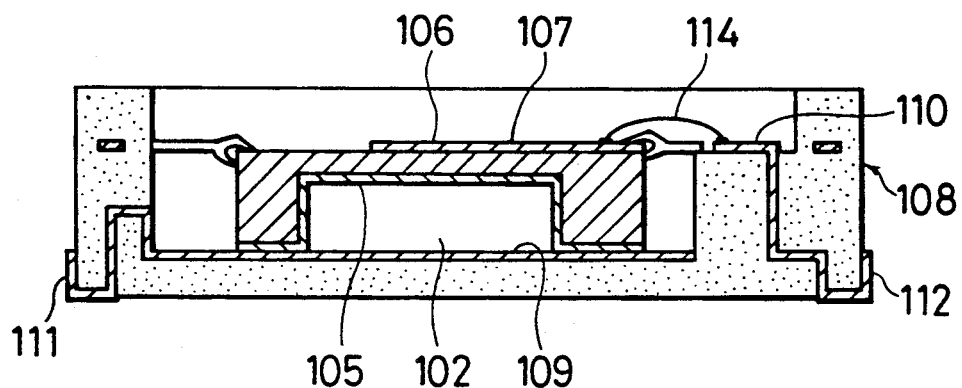
Figure 5D:
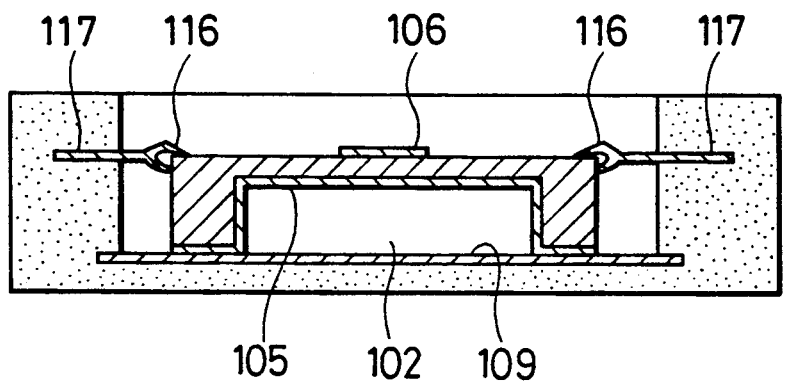

FIG. 5(b) illustrates a structure which solves the above-noted problem. As shown in FIG. 5(b), a through hole 118 is made in a frame-like rib 104 of the resonator 100 at an appropriate position so that the overall electrode 105 of the resonator 100 and a conductive pad 119 on the opposite side therefrom are connected through a conductive film deposited on the interior surface of the through hole 118. The conductive pad 119 and another conductive pad 120 deposited on a stepped portion of the inner wall of the package 108 are connected by a bonding wire 121 and the pad 120 is connected to an external lead member 111 via the conductive film 109 on the bottom of the package, for instance.

Figure 6:
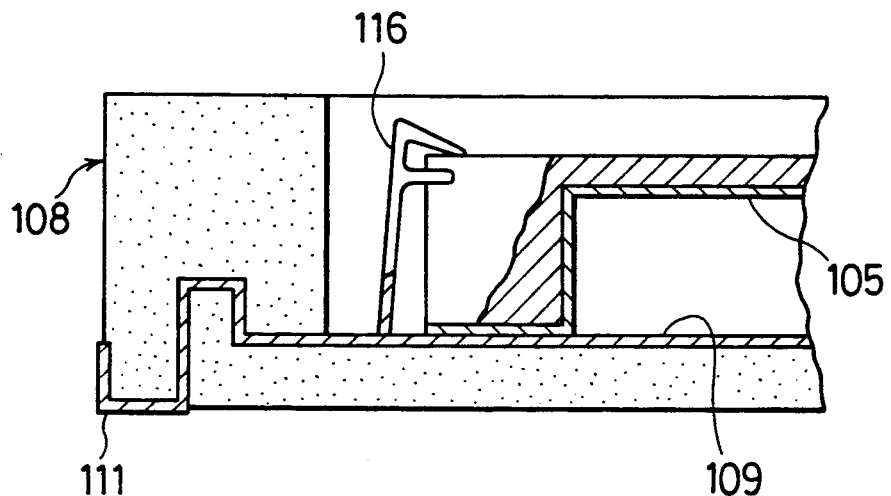
FIG. 6(a) is a partial sectional view illustrating a modified form of the third embodiment of the present invention.
FIG. 6(b) is a development showing claws for urging the resonator.
Figure 6:
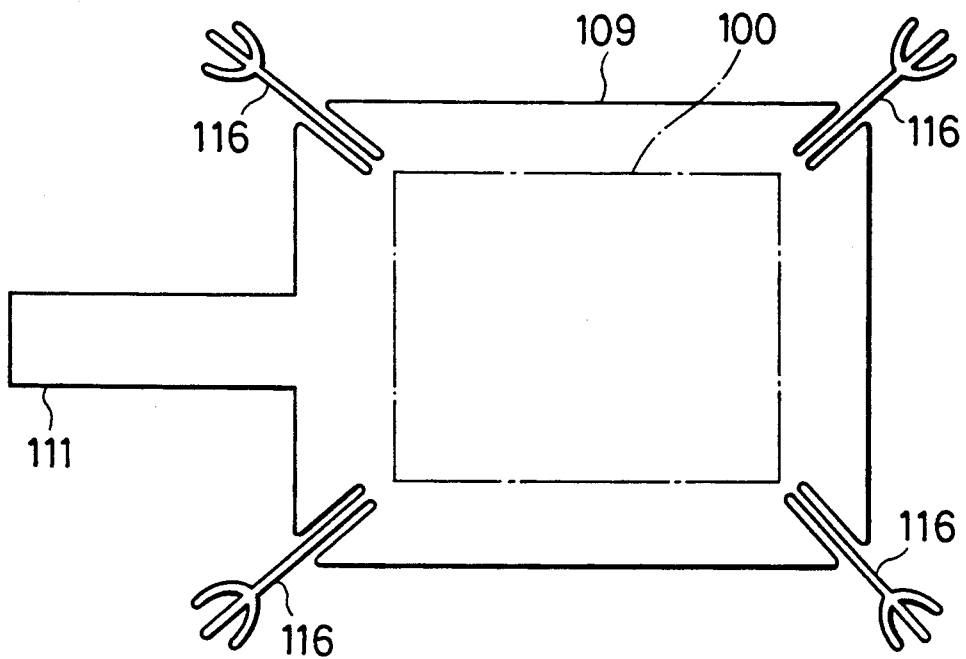

The above is the basic embodiment of the resonator packaging structure according to the present invention, but the invention is not limited specifically thereto but may also be modified as shown in FIGS. 6(a) and (b), in which the elastic pawls 116, 116 . . . project out upward from the bottom of the package.

In this instance, it is preferable that the claws 116, 116 . . . be formed integrally with the conductive film 109 on the bottom of the package, because the package of such a structure can be used housing a filter element as well as for housing a piezoelectric resonator.

Incidentally, it is needless to say that a ceramic package for housing a filter element must be sufficiently grounded, and hence calls for such a large-area conductive film as mentioned above.

Figure 7:
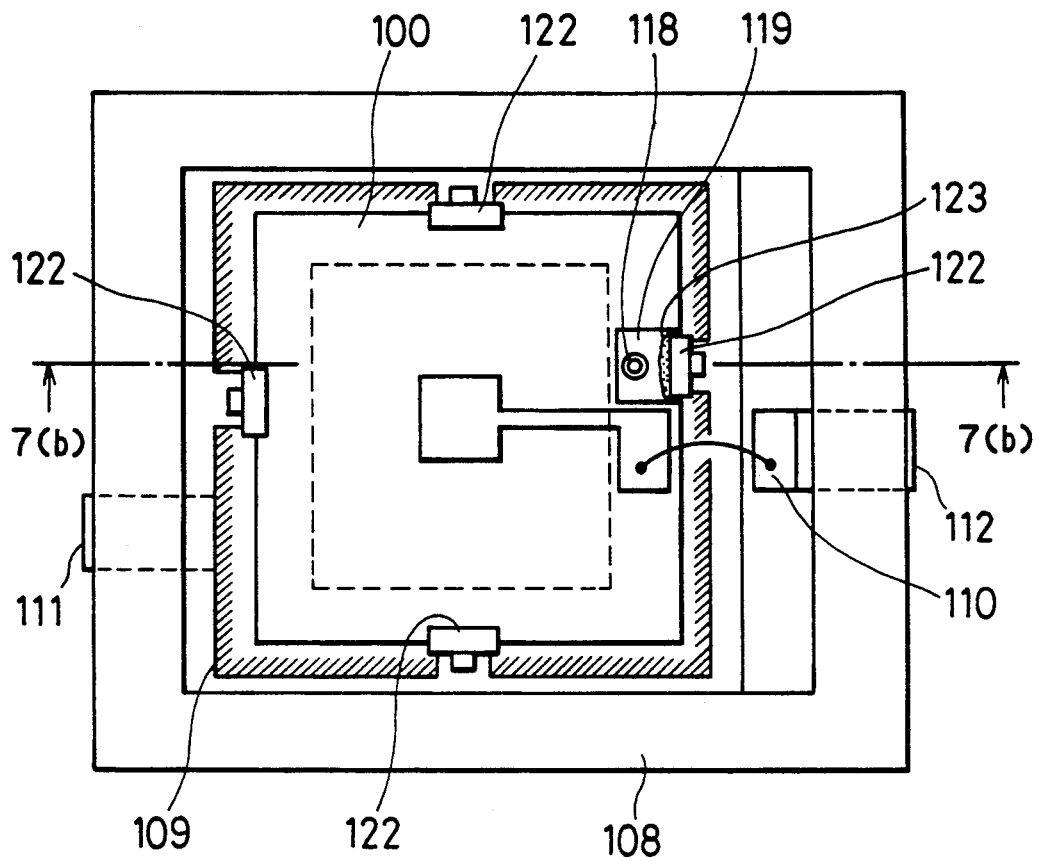
FIGS. 7(a) and (b) are a plan view and a sectional view illustrating another modified form of the third embodiment of the present invention.
Figure 7:
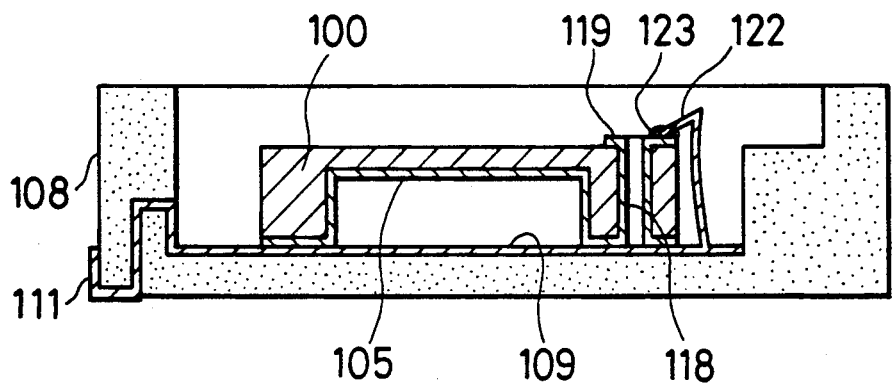

By the way, since the quartz crystal plate and the claws are both microminiature, considerable difficulties are encountered in the formation of the claws and in the positioning of the resonator with respect to the claws when it is inserted into the package. FIGS. 7(a) and (b) illustrate a modified form of the packaging structure of the present invention which is a solution to this problem.

That is, simple-structured claws 122, 122 . . . each having its tip bent at an acute angle, extend upward from the conductive film 109 deposited on the bottom of the package so that they press the resonator 100 at its four corners, and at least one of the claws presses the conductive pad 119 which forms a land of the through hole 118 of the resonator, the tip of this claw 122 being bonded to the pad 119 by a conductive adhesive 123.

Such a structure as mentioned above ensures the electrical connection between the overall electrode 105 of the resonator and the external lead member 111 of the package 108, allows ease in the formation of tips of the claws and in the positioning of the resonator and the claws for their engagement and assures fixing the resonator to the package in position.

Figure 8A:
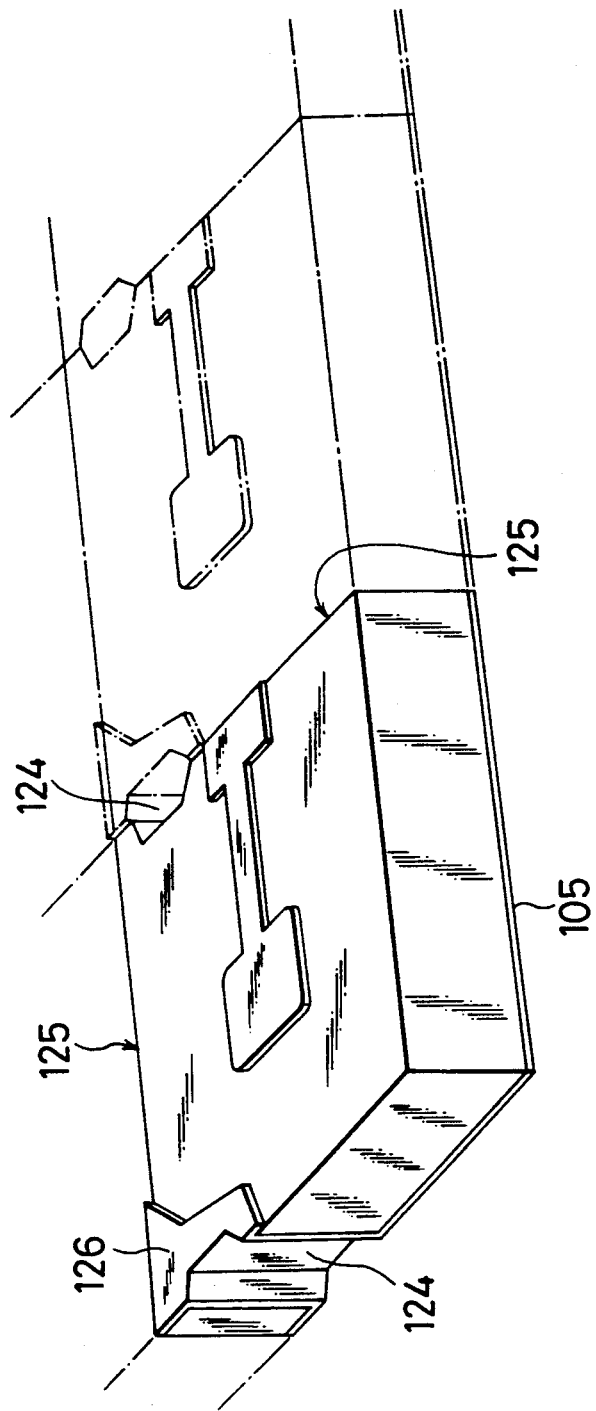
FIGS. 8(a) to (c) are a perspective view and a partial sectional views showing still other modifications of the third embodiment of the present invention.
Figure 8B:
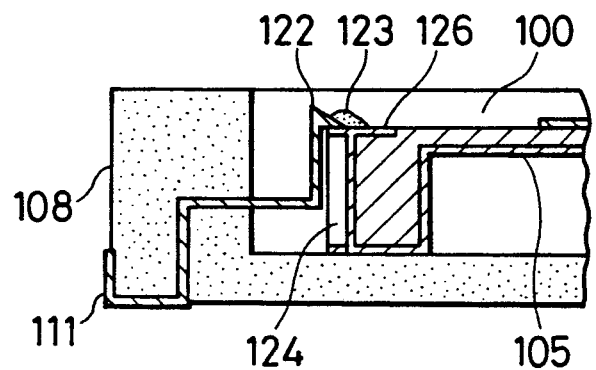
Figure 8C:
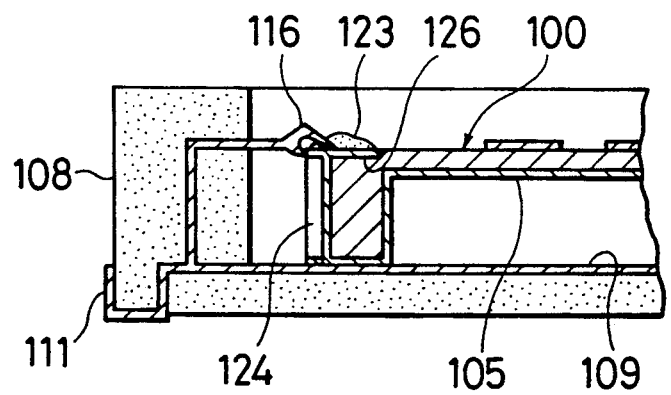
Figure 9:
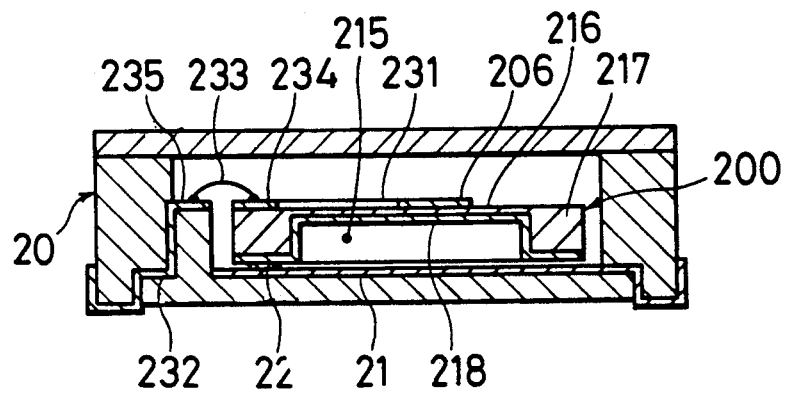
FIG. 9 is a longitudinal-sectional view explanatory of a fourth embodiment of the present invention, showing by way of example, how the resonator utilizing an electrode lead connecting structure according to the fourth embodiment is housed in a package.

While in the above the overall electrode 105 and the conductive pad deposited on the opposite sides of the resonator are connected via the through hole, they may also be connected through utilization of a recess 124 made in one end face of the resonator as shown in FIGS. 8(a) to (c).

As shown in FIG. 8(a), individual resonators having ultrathin vibratory portions to which the present invention is applied are obtained by severing along demarcation lines 125 a piezoelectric wafer having formed thereon a number of olectrode patterns in alignment; accordingly, the recess 124 of a desired shape and construction can be made in one end face of each resonator by making a through hole in the wafer across the demarcation line 125 and depositing a conductive film on the inner wall of the through hole prior to cutting the wafer into individual elements. By connecting the overall electrode 105 and a conductive film 126 on the opposite sides of the resonator through the recess 124 and pressing the pad 125 by the claw 116 or 122 and fixing them together by use of the conductive adhesive 123, it is possible to ensure fixing of the resonator to the package and the electrical connection between the overall electrode and the external lead member 111 of the package.

In the case where the piezoelectric element to be housed in the overall electrode 105 of the resonator 100 may be connected to the external lead member 111 of the package via the claw 122 as shown in FIG. 8(b) because the conductive film 109 on the bottom of the package is not always required. FIG. 8(c) shows another modification for use in the case where the piezoelectric element is a dual mode filter element. Since the overall electrode 105 serves as an earth electrode and must be grounded sufficiently in this case, the overall electrode 10 is connected via a claw 116 to the earth terminal 111, and further, the conductive film 109 on the bottom of the package connected to the terminal 111 is connected to the overall electrode 105.

Thus, the resonator having a ultrathin piezoelectric plate is almost free from stress which causes a variation in its resonance frequency or affects its temperature-frequency characteristic, besides the electrical connection between each electrode of the resonator and the corresponding external terminal can be established without fail.

The packaging structure according to the fourth aspect of the present invention has such a construction as described above, and hence minimizes variations in the resonance frequency of the resonator using a ultrathin piezoelectric plate before and after its packaging and the scatter of its temperature-frequency characteristic after packaging, thus producing a remarkable effect in improving the yield rate of product and its reliability. Moreover, these effects compensate for increased manufacturing costs by a somewhat complicated package structure.

We claim:

1. A structure for supporting a resonator having an ultrathin piezoelectric plate in a package, said structure comprising:
    an ultrathin vibratory portion and a thick rectangular frame-like rib formed integrally with and surrounding said vibratory portion, said vibratory portion and said rib being formed by a cavity made in a substantially central portion of one side of a quartz crystal block; and
    means for preventing adhesive from flowing into said cavity from an adhesive coated region of the frame-like rib, said means comprising an excess adhesive receiving groove cut in one marginal portion of said frame-like rib between the adhesive coated region and an inner marginal edge of said cavity.

2. A structure for supporting a resonator having an ultrathin piezoelectric plate in a package, said structure comprising:
    a quartz crystal resonator having an ultrathin vibratory portion and a thick frame-like rib formed integrally with and surrounding said vibratory portion, said vibratory portion and said rib being formed by a cavity made in a substantially central portion of one side of an AT cut quartz crystal block;
    an electrode lead extending from one marginal portion of the frame-like rib to the vibratory portion; and
    means for bonding the resonator to the package comprising an adhesive coated on only a side of said one marginal portion opposite said electrode lead.

3. A structure for supporting a resonator having an ultrathin piezoelectric plate in a package, comprising:
    a resonator having an ultrathin vibratory portion and a thick frame-like rib formed integrally with and surrounding said vibratory portion, said resonator formed by a cavity made in a substantially central portion of one side of a piezoelectric plate; and means for biasing said one side of said resonator toward a bottom surface of the package, said means comprising a plurality of elastic pawls extending from an inner surface of the package.

4. A structure for supporting a resonator having an ultrathin piezoelectric plate as claimed in claim 3, further comprising:

an electrode lead pattern formed on said one side of said resonator;

a conductive pad formed on an opposite side of said resonator opposite said one side; and means for connecting said conductive pad to a lead terminal exposed on an outside surface of said package;

wherein said electrode lead pattern is electrically connected to the conductive pad via a recess formed in the frame-like rib.

5. A structure for supporting a resonator having an ultrathin piezoelectric plate as claimed in claim 4, wherein one of said elastic pawls is formed of a conductive material and is connected to the lead terminal exposed on the outside surface of said package, wherein said conductive pad is pressed by said one elastic pawl, and wherein said conductive pad and said elastic pawl are bonded together by a conductive adhesive.

6. A structure for supporting a resonator having an ultrathin piezoelectric plate in a package, comprising:

a resonator having an ultrathin vibratory portion and a thick frame-like rib formed integrally with and surrounding said vibratory portion, said resonator being formed by a cavity made in a substantially central portion in one side of a piezoelectric block;

a partial electrode disposed within said cavity; and an electrode lead pattern extending from said partial electrode to an electrode lead end pad formed on a marginal portion of said frame-like rib;

wherein said marginal portion of said frame-like rib is bonded on a side thereof opposite said electrode lead end pad to a bottom surface of said package.

* * * * *